(12) United States Patent
Kerr et al.

(10) Patent No.: US 8,076,750 B1
(45) Date of Patent: Dec. 13, 2011

(54) LINEARITY IMPROVEMENTS OF SEMICONDUCTOR SUBSTRATE BASED RADIO FREQUENCY DEVICES

(75) Inventors: Daniel Charles Kerr, Oak Ridge, NC (US); Thomas Gregory McKay, Boulder Creek, CA (US); Michael Carroll, Jamestown, NC (US); Joseph M. Gering, Stokesdale, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 12/958,494

(22) Filed: Dec. 2, 2010

Related U.S. Application Data

(62) Division of application No. 12/254,499, filed on Oct. 20, 2008, now Pat. No. 7,868,419.

(60) Provisional application No. 60/980,914, filed on Oct. 18, 2007.

(51) Int. Cl.
*H01L 29/00* (2006.01)
(52) U.S. Cl. ......... 257/528; 257/531; 438/381; 438/763
(58) Field of Classification Search .................... 257/19, 257/273, 528, 531; 331/179; 336/200; 438/381, 438/763
See application file for complete search history.

(56) References Cited

U.S. PATENT DOCUMENTS

| | | | |
|---|---|---|---|
| 7,305,223 B2 | 12/2007 | Liu et al. | |
| 2004/0173872 A1 | 9/2004 | Park et al. | |
| 2007/0215976 A1* | 9/2007 | Degani et al. | 257/528 |
| 2008/0173974 A1 | 7/2008 | Van Noort et al. | |
| 2009/0267147 A1* | 10/2009 | De Boet et al. | 257/337 |
| 2009/0322448 A1* | 12/2009 | Bhave et al. | 333/186 |

OTHER PUBLICATIONS

Aspar, B. et al., "IC's Performance Improvement and 3D Integration by Layer Transfer Technologies," 2006 IEEE International SOI Conference Proceedings, 2006, pp. 8-12, IEEE.
Gamble, H. S. et al., "Low-Loss CPW Lines on Surface Stabilized High-Resistivity Silicon," IEEE Microwave and Guided Wave Letters, Oct. 1999, pp. 395-397, vol. 9, No. 10, IEEE.
Hirae, S. et al., "Energy Distribution of Trapping States in Polycrystalline Silicon," J. Appl. Phys., Feb. 1980, pp. 1043-1047, vol. 51, No. 2, American Institute of Physics.
Lederer, D. et al, "Enhanced High Resistivity SOI Wafers for RF Applications," 2004 IEEE International SOI Conference, Oct. 4-7, 2004, pp. 46-47, IEEE.
Lederer, D. et al., "New Substrate Passivation Method Dedicated to HR SOI Wafer Fabrication with Increased Substrate Resistivity," IEEE Electron Device Letters, Nov. 2005, pp. 805-807, vol. 26, No. 11, IEEE.

(Continued)

*Primary Examiner* — Thanh V Pham
*Assistant Examiner* — Errol Fernandes
(74) *Attorney, Agent, or Firm* — Withrow & Terranova, P.L.L.C.

(57) ABSTRACT

The present invention relates to using a trap-rich layer, such as a polycrystalline Silicon layer, over a semiconductor substrate to substantially immobilize a surface conduction layer at the surface of the semiconductor substrate at radio frequency (RF) frequencies. The trap-rich layer may have a high density of traps that trap carriers from the surface conduction layer. The average release time from the traps may be longer than the period of any present RF signals, thereby effectively immobilizing the surface conduction layer, which may substantially prevent capacitance and inductance changes due to the RF signals. Therefore, harmonic distortion of the RF signals may be significantly reduced or eliminated. The semiconductor substrate may be a Silicon substrate, a Gallium Arsenide substrate, or another substrate.

13 Claims, 12 Drawing Sheets

OTHER PUBLICATIONS

Lederer, D. et al, "Performance of SOI devices transferred onto passivated HR SOI substrates using a layer transfer technique," 2006 IEEE International SOI Conference, Oct. 2-5, 2006, pp. 29-30, IEEE.

Wu, Y. et al., "The Effect of a SiO2 Interface Layer on CPW Lines and Schottky Barrier Diodes on HRS Substrates," Silicon Monolithic Integrated Circuits in RF Systems, 1998, pp. 178-180, British Crown Copyrights.

Wu, Yunhong et al., "SiO2 Interface Layer Effects on Microwave Loss of High-Resistivity CPW Line," IEEE Microwave and Guided Wave Letters, Jan. 1999, pp. 10-12, vol. 9, No, 1, IEEE.

Notice of Allowance mailed Sep. 3, 2010 regarding U.S. Appl. No. 12/254,499, now U.S. Patent No. 7,868,419.

Nonfinal Office Action mailed Mar. 11, 2010 regarding U.S. Appl. No. 12/254,499, now U.S. Patent No. 7,868,419.

* cited by examiner

LINEARITY IMPROVEMENTS OF SEMICONDUCTOR SUBSTRATE BASED RADIO FREQUENCY DEVICES

This application is a Divisional of U.S. patent application Ser. No. 12/254,499, filed Oct. 20, 2008, now U.S. Pat. No. 7,868,419, which claims the benefit of U.S. Provisional Patent Application 60/980,914, filed Oct. 18, 2007, the disclosures of which are hereby incorporated herein by reference in their entireties.

FIELD OF THE INVENTION

Embodiments of the present invention relate to Silicon substrates used to manufacture semiconductor devices, which may be used in radio frequency (RF) communications systems.

BACKGROUND OF THE INVENTION

Silicon substrates are widely used in the manufacture of semiconductor devices. Low cost and highly evolved manufacturing techniques make Silicon a preferred material in many applications, when compared with other semiconductor materials. High resistivity Silicon substrates may be used in radio frequency (RF) devices. If the period of an RF signal is shorter than a majority carrier relaxation time, then the majority carriers in a Silicon substrate may not respond to the RF signal. The majority carriers may appear to be frozen and the Silicon substrate may behave as a dielectric. However, Silicon has certain characteristics that may produce undesirable behavior in some RF applications. For example, the doping level in high resistivity Silicon is very low or non-existent; therefore, oxide charges at the surface of a Silicon substrate, or a weak electric field in the Silicon substrate can induce an inversion or accumulation layer, which may function as a surface conduction layer at the surface of the Silicon substrate. RF signals traversing above the surface of the Silicon substrate may modulate the surface conduction layer, which may cause non-linear capacitance, non-linear conductance, or both affecting RF interactions between the Silicon substrate and other layers. The non-linear characteristics may introduce harmonic distortion in the RF signals, which may exceed allowable limits.

One technique for reducing the impact of the non-linear characteristics is to incorporate a conductive shielding layer between the surface of the Silicon substrate and other layers handling RF signals; however, the conductive shielding layer may increase complexity and signal loss. Thus, there is a need to reduce, or eliminate, non-linear characteristics associated with a surface conduction layer without using a conductive shielding layer.

SUMMARY OF THE EMBODIMENTS

The present invention relates to using a trap-rich layer, such as a polycrystalline Silicon layer, over a semiconductor substrate to substantially immobilize a surface conduction layer at the surface of the semiconductor substrate at radio frequency (RF) frequencies. The trap-rich layer may have a high density of traps that trap carriers from the surface conduction layer. The average release time from the traps may be longer than the period of any present RF signals, thereby effectively immobilizing the surface conduction layer, which may substantially prevent capacitance and inductance changes due to the RF signals. Therefore, harmonic distortion of the RF signals may be significantly reduced or eliminated. The semiconductor substrate may be a Silicon substrate, a Gallium Arsenide substrate, or another substrate.

In one embodiment of the present invention, a metallization layer may be applied directly to the trap-rich layer. Other embodiments of the present invention may include one or more intervening layers between the trap-rich layer and the metallization layer. The metallization layer may be used to form an RF inductive element, an RF coupler, a micro-electromechanicalsystems (MEMS) RF device, such as a MEMS RF switch, or any combination thereof. In an alternate embodiment of the present invention, an insulator layer may be located between the trap-rich layer and the metallization layer. In an additional embodiment of the present invention, the trap-rich layer may be included in a Silicon-on-insulator (SOI) wafer. The SOI wafer may include the semiconductor substrate, the trap-rich layer may be formed over the semiconductor substrate, an insulator layer may be formed over the trap-rich layer, and an SOI device layer may be formed over the insulator layer. The SOI wafer may provide an RF transistor element, a MEMS RF device, such as a MEMS RF filter, or both. The semiconductor substrate may be a Silicon substrate, a Gallium Arsenide substrate, or another substrate.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention relates to using a trap-rich layer, such as a polycrystalline Silicon layer, over a semiconductor substrate to substantially immobilize a surface conduction layer at the surface of the semiconductor substrate at radio frequency (RF) frequencies. The trap-rich layer may have a high density of traps that trap carriers from the surface conduction layer. The average release time from the traps may be longer than the period of any present RF signals, thereby effectively immobilizing the surface conduction layer, which may substantially prevent capacitance and inductance changes due to the RF signals. Therefore, harmonic distortion of the RF signals may be significantly reduced or eliminated. The semiconductor substrate may be a Silicon substrate, a Gallium Arsenide substrate, or another substrate. In one embodiment of the present invention, the trap-rich layer is an amorphous Silicon film, which may be formed by modifying a top layer of a Silicon substrate to induce a large number of traps. Ions may be implanted to disrupt the Silicon lattice of the Silicon substrate to make it amorphous.

In one embodiment of the present invention, a metallization layer may be applied directly to the trap-rich layer. Other embodiments of the present invention may include one or more intervening layers between the trap-rich layer and the metallization layer. The metallization layer may be used to form an RF inductive element, an RF coupler, a micro-electromechanical systems (MEMS) RF device, such as a MEMS RF switch, or any combination thereof. In an alternate embodiment of the present invention, an insulator layer may be located between the trap-rich layer and the metallization layer. In an additional embodiment of the present invention, the trap-rich layer may be included in a Silicon-on-insulator (SOI) wafer. The SOI wafer may include the semiconductor substrate, the trap-rich layer may be formed over the semiconductor substrate, an insulator layer may be formed over the trap-rich layer, and an SOI device layer may be formed over the insulator layer. The SOI wafer may provide an RF transistor element, a MEMS RF device, such as a MEMS RF filter, or both. The semiconductor substrate may be a Silicon substrate, a Gallium Arsenide substrate, or another substrate.

Figure 1:
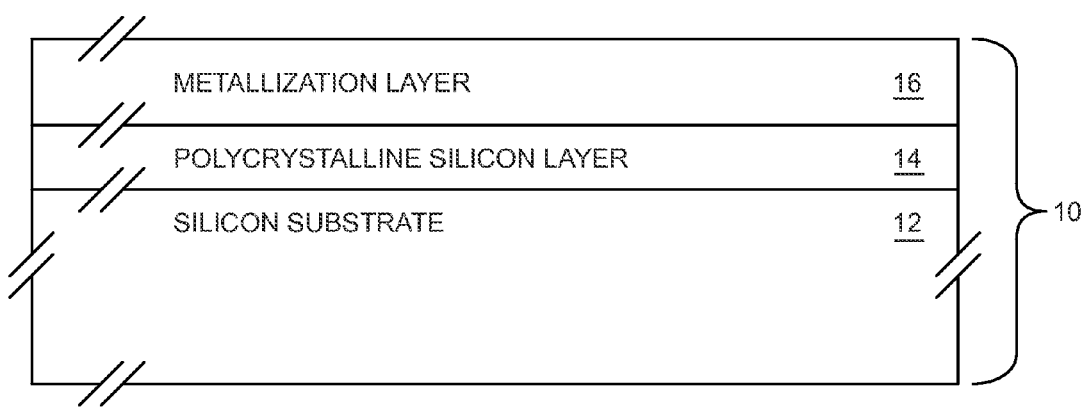
FIG. 1 shows a first semiconductor wafer, according to one embodiment of the present invention.

FIG. 1 shows a side view of a first semiconductor wafer 10, according to one embodiment of the present invention. The first semiconductor wafer 10 includes a Silicon substrate 12. A polycrystalline Silicon layer 14 is formed over the Silicon substrate 12. A layer using a different trap-rich material may be used instead of the polycrystalline Silicon layer 14, according to alternate embodiments of the present invention. A metallization layer 16 is formed over the polycrystalline Silicon layer 14. The polycrystalline Silicon layer 14 may have a high density of traps, which may be used to trap carriers from the Silicon substrate 12, the polycrystalline Silicon layer 14, or both. Trapping carriers may substantially immobilize a surface conduction layer (not shown) in the Silicon substrate 12. The Silicon substrate 12 may or may not be doped. The Silicon substrate 12 may be doped to form N-type material, P-type material, or both. The polycrystalline Silicon layer 14 may or may not be doped. The polycrystalline Silicon layer 14 may be doped to form N-type material, P-type material, or both. The polycrystalline Silicon layer 14 may passivate the surface of the Silicon substrate 12. A carrier concentration in the polycrystalline Silicon layer 14 may be less than a concentration of traps in the polycrystalline Silicon layer 14. A thickness of the polycrystalline Silicon layer 14 may be greater than about 100 nanometers. An average release time of a carrier in a trap in the polycrystalline Silicon layer 14 may be greater than about 100 microseconds. In an exemplary embodiment of the present invention, the average release time of a carrier in a trap in the polycrystalline Silicon layer 14 is greater than about one millisecond. Other embodiments of the present invention may use another semiconductor substrate in place of the Silicon substrate 12, such as Gallium Arsenide. In one embodiment of the present invention, the trap-rich layer is an amorphous Silicon film, which may be formed by modifying a top layer of the Silicon substrate 12 to induce a large number of traps. Ions may be implanted to disrupt the Silicon lattice of the Silicon substrate 12 to make it amorphous.

The polycrystalline Silicon layer 14 may be in electrical contact with the Silicon substrate 12. The Silicon substrate 12 may have a thin oxide layer (not shown), which may have a thickness of less than about 20 angstroms and may be formed when the polycrystalline Silicon layer 14 is formed over the Silicon substrate 12. The thin oxide layer may be formed based on the process technique used to add the polycrystalline Silicon layer 14, such as low pressure chemical vapor deposition (LPCVD). However, the thin oxide layer would not normally interfere with carrier transfer between the polycrystalline Silicon layer 14 and the Silicon substrate 12. The Silicon substrate 12 may have a majority carrier relaxation time, which may be about equal to a resistivity of the Silicon substrate 12 times a dielectric permittivity of the Silicon substrate 12. In an exemplary embodiment of the present invention, the thickness of the polycrystalline Silicon layer 14 may be equal to about 300 nanometers. The resistivity of the Silicon substrate 12 may be greater than about 1000 ohm centimeters. The dielectric permittivity of the Silicon substrate 12 may be equal to about one picofarad per centimeter. The majority carrier relaxation time of the Silicon substrate 12 may be equal to about one nanosecond. Alternate embodiments of the present invention may include one or more intervening layers between the Silicon substrate 12 and the polycrystalline Silicon layer 14, between the polycrystalline Silicon layer 14 and the metallization layer 16, or both. However, any intervening layers between the Silicon substrate 12 and the polycrystalline Silicon layer 14 must not interfere with carrier transfer between the polycrystalline Silicon layer 14 and the Silicon substrate 12.

Figure 2:
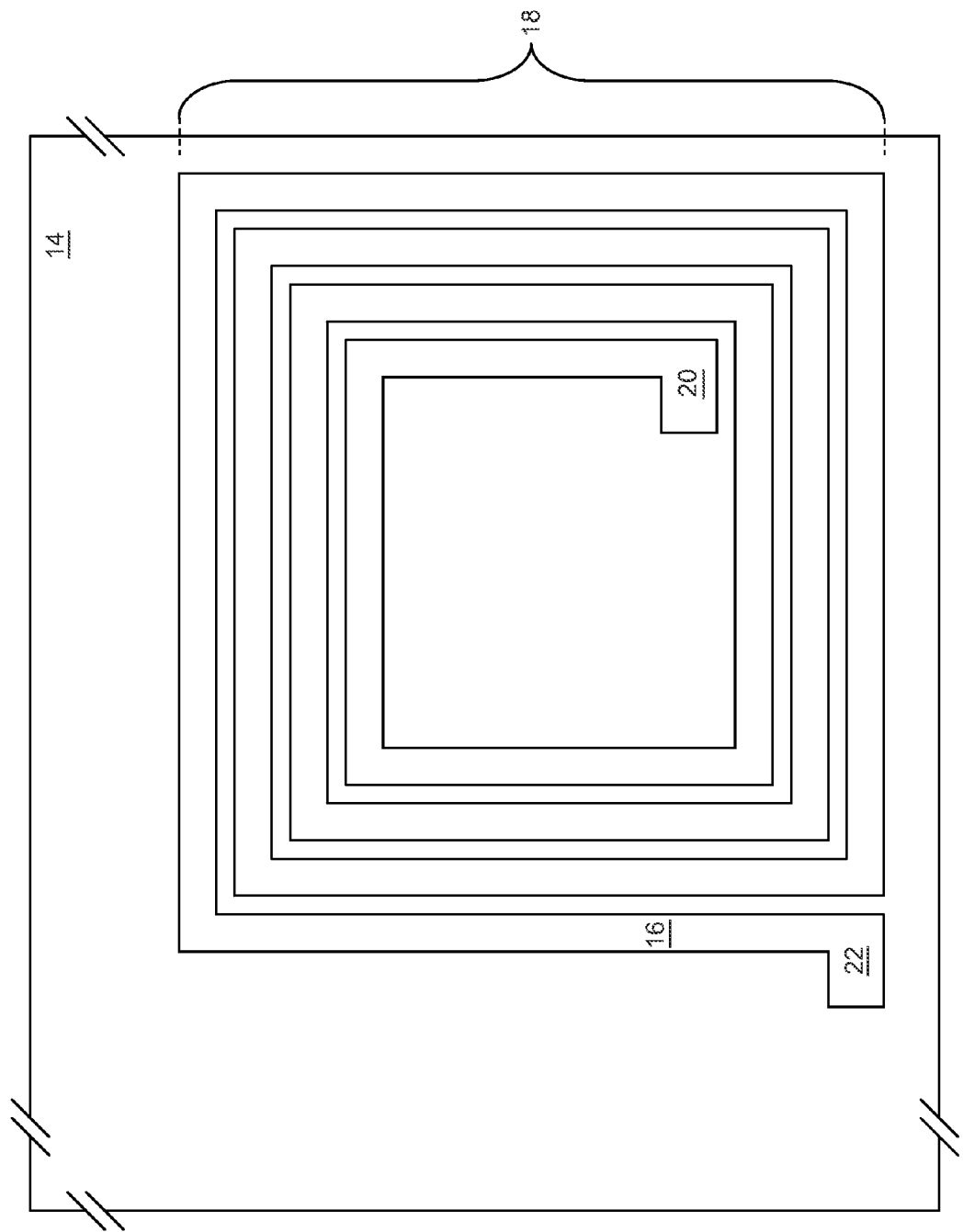
FIG. 2 shows a radio frequency (RF) inductive element provided by the first semiconductor wafer illustrated in FIG. 1.

FIG. 2 shows a top view of an RF inductive element 18 provided by the first semiconductor wafer 10 illustrated in FIG. 1. The RF inductive element 18 may be formed using the metallization layer 16 and may include a first inductive terminal 20 conductively coupled to a second inductive terminal 22. The RF inductive element 18 may be associated with an RF signal, which may have an RF signal period that is less than or equal to the majority carrier relaxation time of the Silicon substrate 12. In an exemplary embodiment of the present invention, the majority carrier relaxation time of the Silicon substrate 12 is equal to about one nanosecond and the RF signal period is less than or equal to about one nanosecond.

Figure 3:
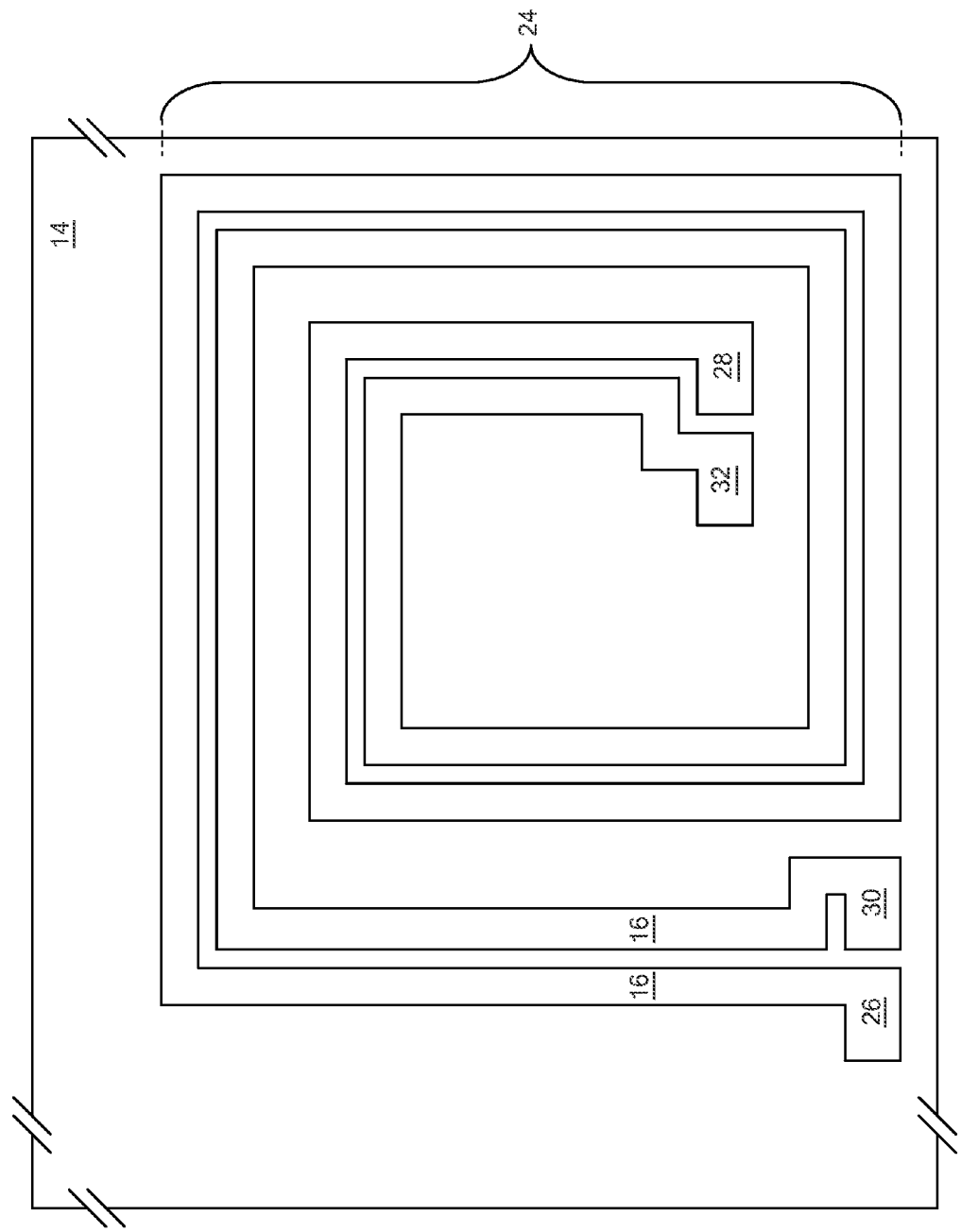
FIG. 3 shows an RF coupler provided by the first semiconductor wafer illustrated in FIG. 1.

FIG. 3 shows a top view of an RF coupler 24 provided by the first semiconductor wafer 10 illustrated in FIG. 1. The RF coupler 24 may be formed using the metallization layer 16 and may include a first coupler terminal 26 conductively coupled to a second coupler terminal 28, and a third coupler terminal 30 conductively coupled to a fourth coupler terminal 32. The first and second coupler terminals 26, 28 may be magnetically coupled to the third and fourth coupler terminals 30, 32. The RF coupler 24 may be associated with an RF signal, which may have an RF signal period that is less than or equal to the majority carrier relaxation time of the Silicon substrate 12. In an exemplary embodiment of the present invention, the majority carrier relaxation time of the Silicon substrate 12 is equal to about one nanosecond and the RF signal period is less than or equal to about one nanosecond.

Figure 4:
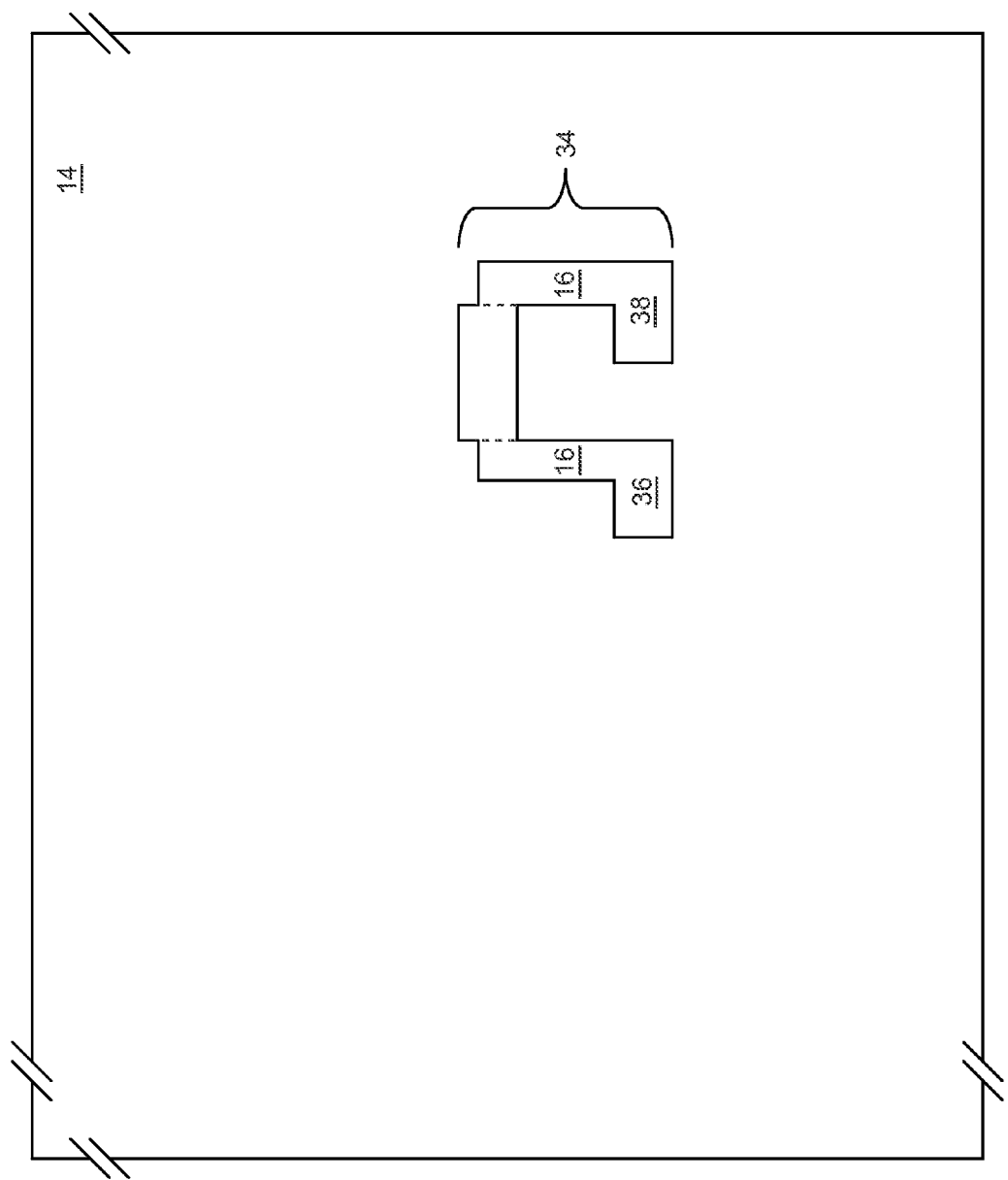
FIG. 4 shows a micro-electromechanical systems (MEMS) RF switch provided by the first semiconductor wafer illustrated in FIG. 1.

FIG. 4 shows a top view of a MEMS RF switch 34 provided by the first semiconductor wafer 10 illustrated in FIG. 1. The MEMS RF switch 34 may be formed using the metallization layer 16 and may include a first MEMS terminal 36 and a second MEMS terminal 38. When the MEMS RF switch 34 is in a closed state, the first MEMS terminal 36 may be conductively coupled to the second MEMS terminal 38. When the MEMS RF switch 34 is in an open state, the first MEMS terminal 36 may be electrically isolated from the second MEMS terminal 38. The MEMS RF switch 34 may be associated with an RF signal, which may have an RF signal period that is less than or equal to the majority carrier relaxation time of the Silicon substrate 12. In an exemplary embodiment of the present invention, the majority carrier relaxation time of the Silicon substrate 12 is equal to about one nanosecond and the RF signal period is less than or equal to about one nanosecond. Alternate embodiments of the present invention may provide other MEMS devices by the first semiconductor wafer 10 illustrated in FIG. 1. The other MEMS devices may be formed using the metallization layer 16.

Figure 5:
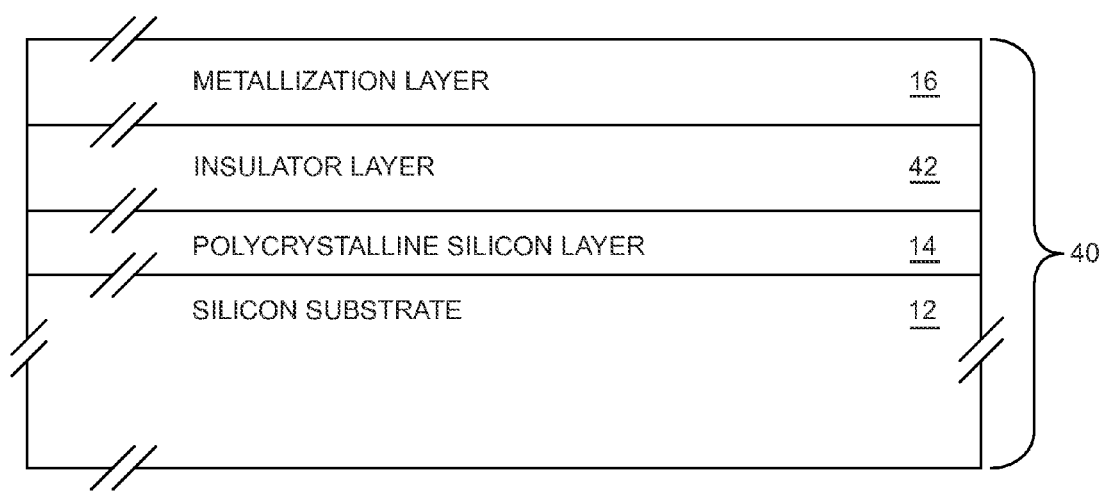
FIG. 5 shows a second semiconductor wafer, according to an alternate embodiment of the present invention.

FIG. 5 shows a side view of a second semiconductor wafer 40, according to an alternate embodiment of the present invention. An insulator layer 42 may be formed over the polycrystalline Silicon layer 14, and the metallization layer 16 may be formed over the insulator layer 42. A layer using a different trap-rich material may be used instead of the polycrystalline Silicon layer 14, according to alternate embodiments of the present invention. The insulator layer 42 may include dielectric material. In a first embodiment of the present invention, the insulator layer 42 includes Silicon Dioxide. In a second embodiment of the present invention, the insulator layer 42 includes Silicon Nitride. Alternate embodiments of the present invention may include one or more intervening layers between the Silicon substrate 12 and the polycrystalline Silicon layer 14, between the polycrystalline Silicon layer 14 and the insulator layer 42, between the insulator layer 42 and the metallization layer 16, or any combination thereof. However, any intervening layers between the Silicon substrate 12 and the polycrystalline Silicon layer 14 must not interfere with carrier transfer between the polycrystalline Silicon layer 14 and the Silicon substrate 12. Other embodiments of the present invention may use another semiconductor substrate in place of the Silicon substrate 12, such as Gallium Arsenide. In one embodiment of the present invention, the trap-rich layer is an amorphous Silicon film, which may be formed by modifying a top layer of the Silicon substrate 12 to induce a large number of traps. Ions may be implanted to disrupt the Silicon lattice of the Silicon substrate 12 to make it amorphous.

Figure 6:
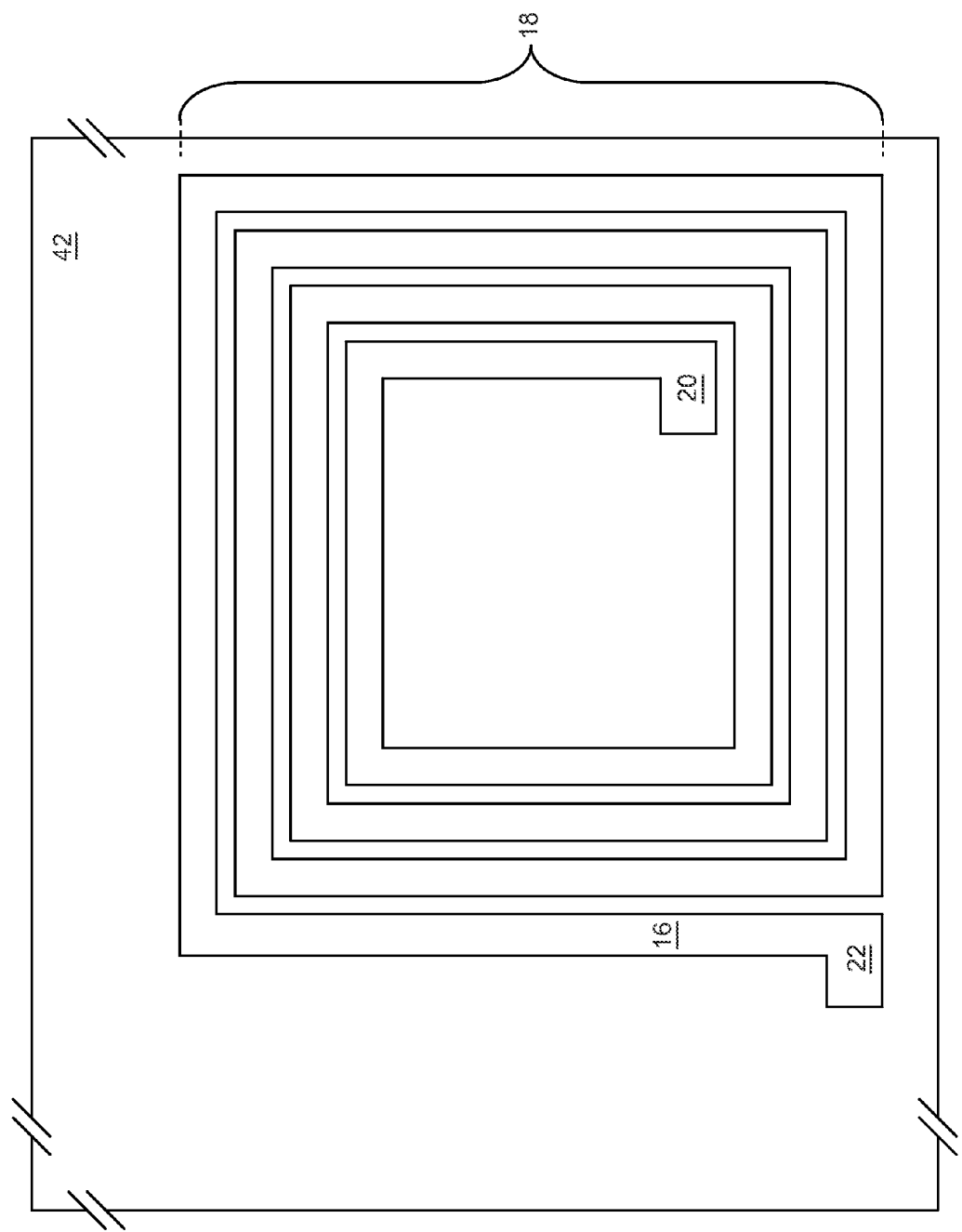
FIG. 6 shows an RF inductive element provided by the second semiconductor wafer illustrated in FIG. 5.

FIG. 6 shows a top view of the RF inductive element 18 provided by the second semiconductor wafer 40 illustrated in FIG. 5. The RF inductive element 18 may be formed using the metallization layer 16 and may include the first inductive terminal 20 conductively coupled to the second inductive terminal 22. The RF inductive element 18 may be associated with an RF signal, which may have an RF signal period that is less than or equal to the majority carrier relaxation time of the Silicon substrate 12. In an exemplary embodiment of the present invention, the majority carrier relaxation time of the Silicon substrate 12 is equal to about one nanosecond and the RF signal period is less than or equal to about one nanosecond.

Figure 7:
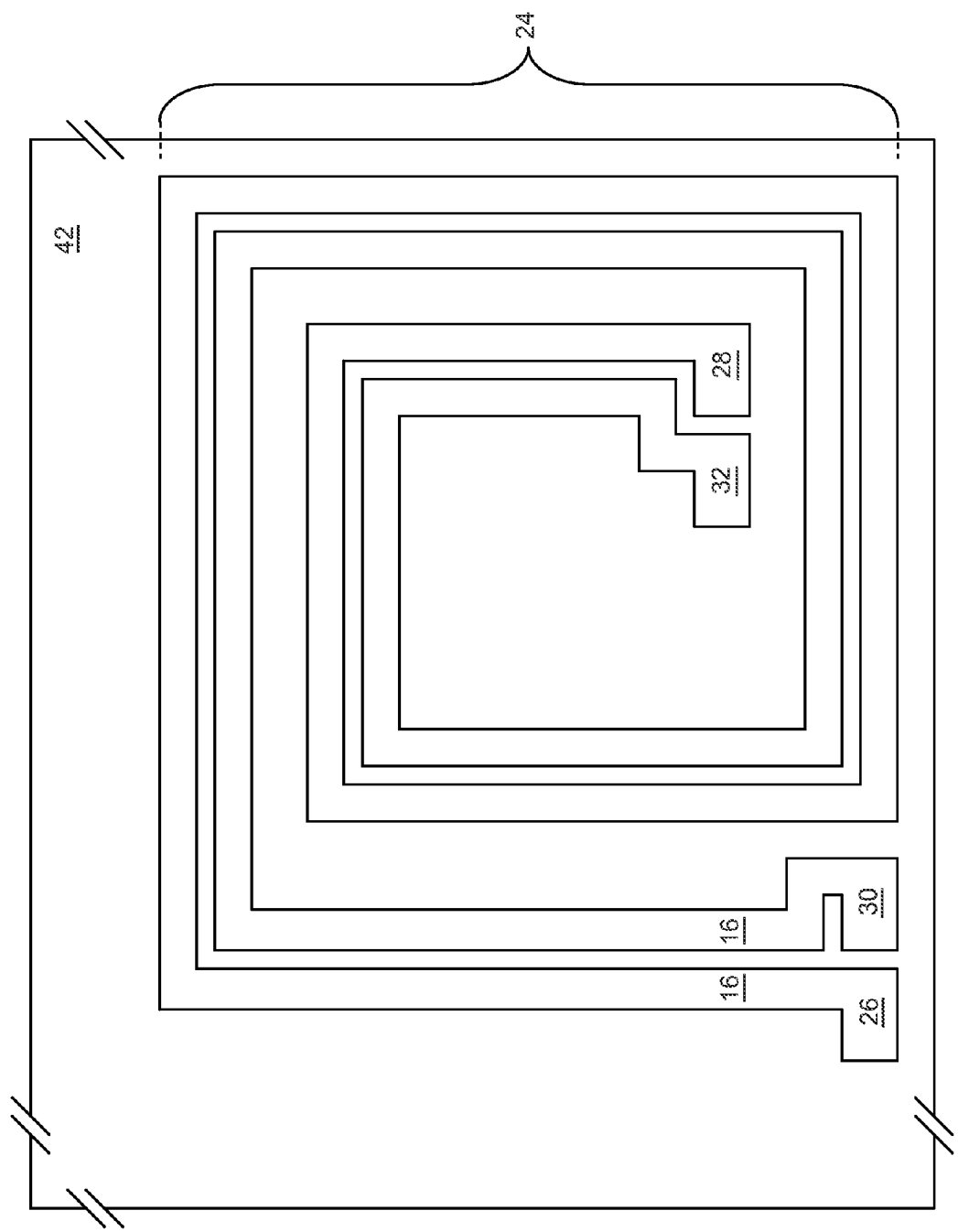
FIG. 7 shows an RF coupler provided by the second semiconductor wafer illustrated in FIG. 5.

FIG. 7 shows a top view of the RF coupler 24 provided by the second semiconductor wafer 40 illustrated in FIG. 5. The RF coupler 24 may be formed using the metallization layer 16 and may include the first coupler terminal 26 conductively coupled to the second coupler terminal 28, and the third coupler terminal 30 conductively coupled to the fourth coupler terminal 32. The first and second coupler terminals 26, 28 may be magnetically coupled to the third and fourth coupler terminals 30, 32. The RF coupler 24 may be associated with an RF signal, which may have an RF signal period that is less than or equal to the majority carrier relaxation time of the Silicon substrate 12. In an exemplary embodiment of the present invention, the majority carrier relaxation time of the Silicon substrate 12 is equal to about one nanosecond and the RF signal period is less than or equal to about one nanosecond.

Figure 8:
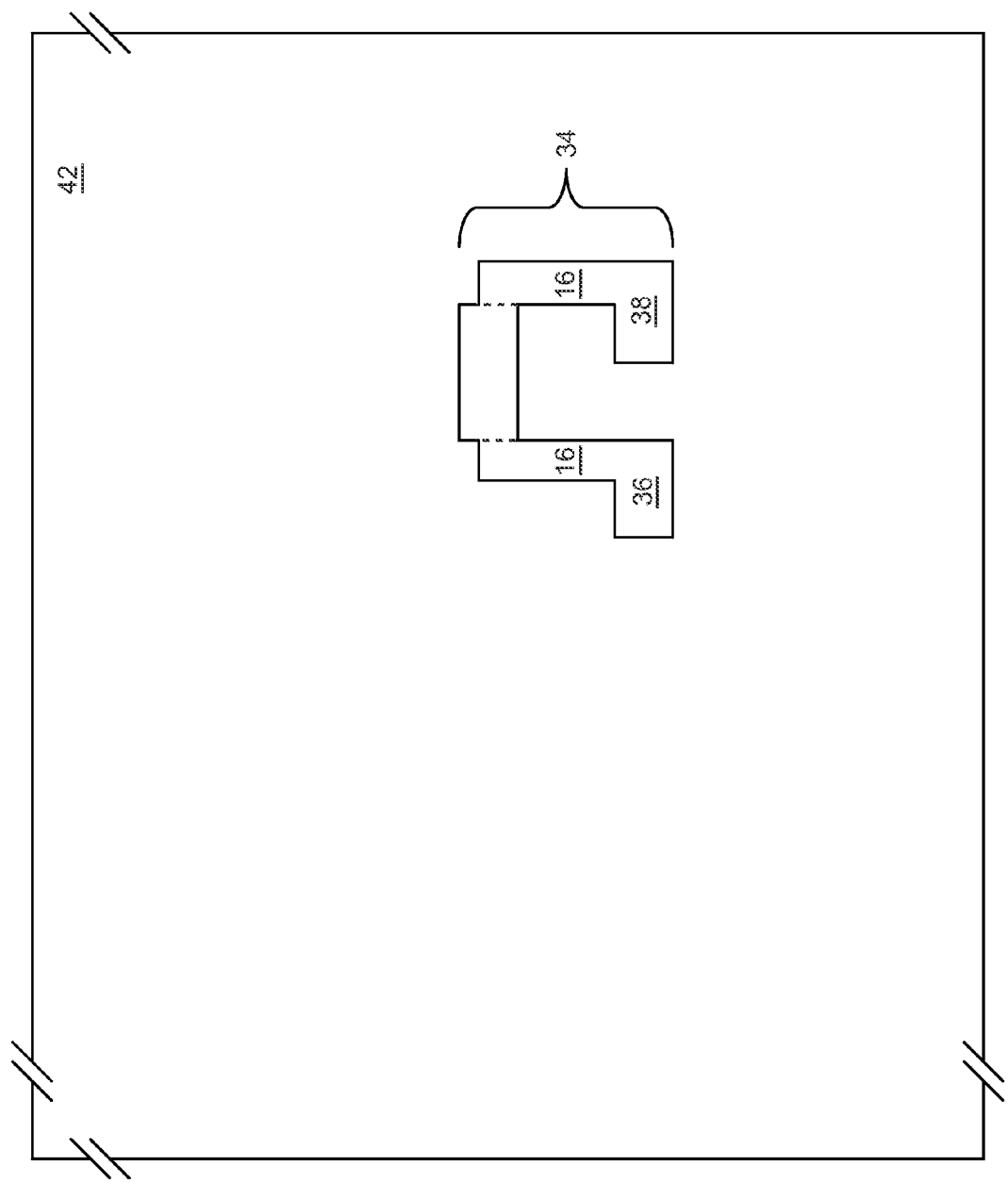
FIG. 8 shows a MEMS RF switch provided by the second semiconductor wafer illustrated in FIG. 5.

FIG. 8 shows a top view of the MEMS RF switch 34 provided by the second semiconductor wafer 40 illustrated in FIG. 5. The MEMS RF switch 34 may be formed using the metallization layer 16 and may include the first MEMS terminal 36 and the second MEMS terminal 38. When the MEMS RF switch 34 is in a closed state, the first MEMS terminal 36 may be conductively coupled to the second MEMS terminal 38. When the MEMS RF switch 34 is in an open state, the first MEMS terminal 36 may be electrically isolated from the second MEMS terminal 38. The MEMS RF switch 34 may be associated with an RF signal, which may have an RF signal period that is less than or equal to the majority carrier relaxation time of the Silicon substrate 12. In an exemplary embodiment of the present invention, the majority carrier relaxation time of the Silicon substrate 12 is equal to about one nanosecond and the RF signal period is less than or equal to about one nanosecond. Alternate embodiments of the present invention may provide other MEMS devices by the second semiconductor wafer 40 illustrated in FIG. 5. The other MEMS devices may be formed using the metallization layer 16.

Figure 9:
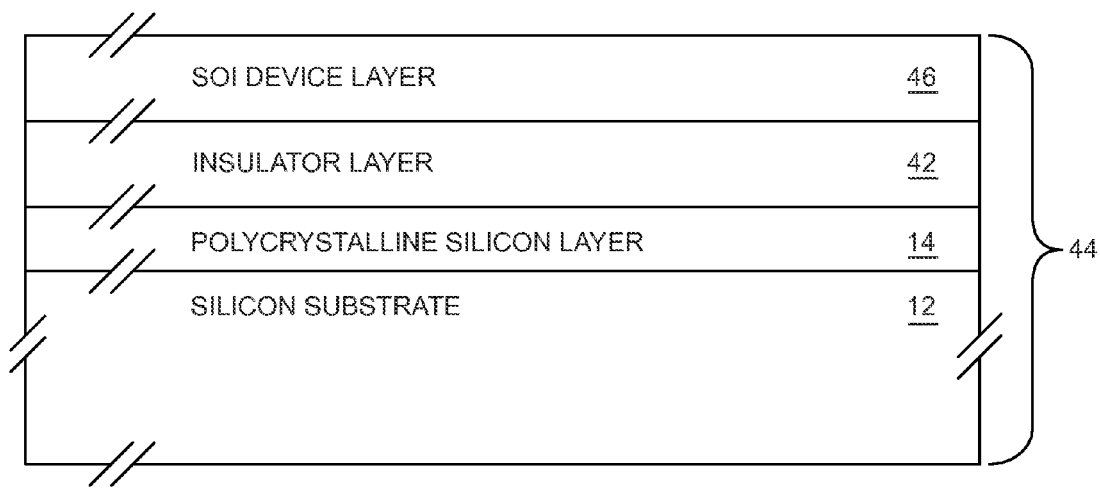
FIG. 9 shows a Silicon-on-insulator (SOI) wafer, according to an additional embodiment of the present invention.

FIG. 9 shows a side view of an SOI wafer 44, according to an additional embodiment of the present invention. The SOI wafer 44 includes the Silicon substrate 12. The polycrystalline Silicon layer 14 is formed over the Silicon substrate 12, the insulator layer 42 is formed over the polycrystalline Silicon layer 14, and an SOI device layer 46 is formed over the insulator layer 42. A layer using a different trap-rich material may be used instead of the polycrystalline Silicon layer 14, according to alternate embodiments of the present invention. The insulator layer 42 may include dielectric material. In a first embodiment of the present invention, the insulator layer 42 includes Silicon Dioxide. In a second embodiment of the present invention, the insulator layer 42 includes Silicon Nitride. Alternate embodiments of the present invention may include one or more intervening layers between the Silicon substrate 12 and the polycrystalline Silicon layer 14, between the polycrystalline Silicon layer 14 and the insulator layer 42, between the insulator layer 42 and the SOI device layer 46, or any combination thereof. However, any intervening layers between the Silicon substrate 12 and the polycrystalline Silicon layer 14 must not interfere with carrier transfer between the polycrystalline Silicon layer 14 and the Silicon substrate 12. Other embodiments of the present invention may use another semiconductor substrate in place of the Silicon substrate 12, such as Gallium Arsenide. In one embodiment of the present invention, the trap-rich layer is an amorphous Silicon film, which may be formed by modifying a top layer of the Silicon substrate 12 to induce a large number of traps. Ions may be implanted to disrupt the Silicon lattice of the Silicon substrate 12 to make it amorphous.

Figure 10:
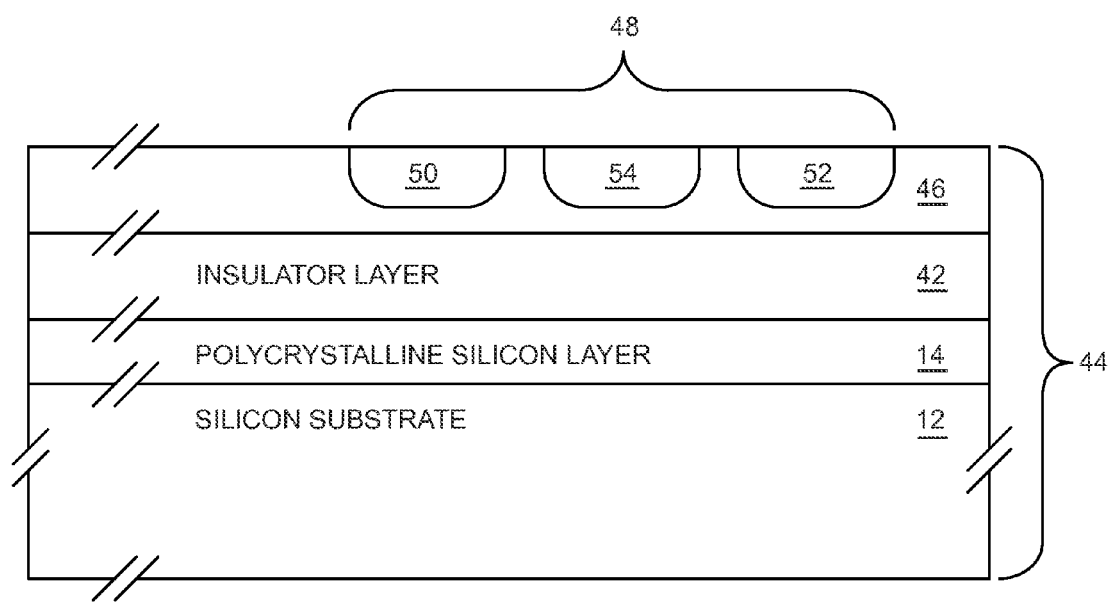
FIG. 10 shows an RF transistor element provided by the SOI wafer illustrated in FIG. 9.

FIG. 10 shows a side view of an RF transistor element 48 provided by the SOI wafer 44 illustrated in FIG. 9. The RF transistor element 48 may be formed from the SOI device layer 46 and may include a field effect transistor (FET) element having a source 50, a drain 52, and a gate 54 that may be formed using doped areas of the SOI device layer 46. In alternate embodiments of the present invention, the RF transistor element 48 may include a bipolar transistor element (not shown), a metal oxide semiconductor FET, or both.

Figure 11:
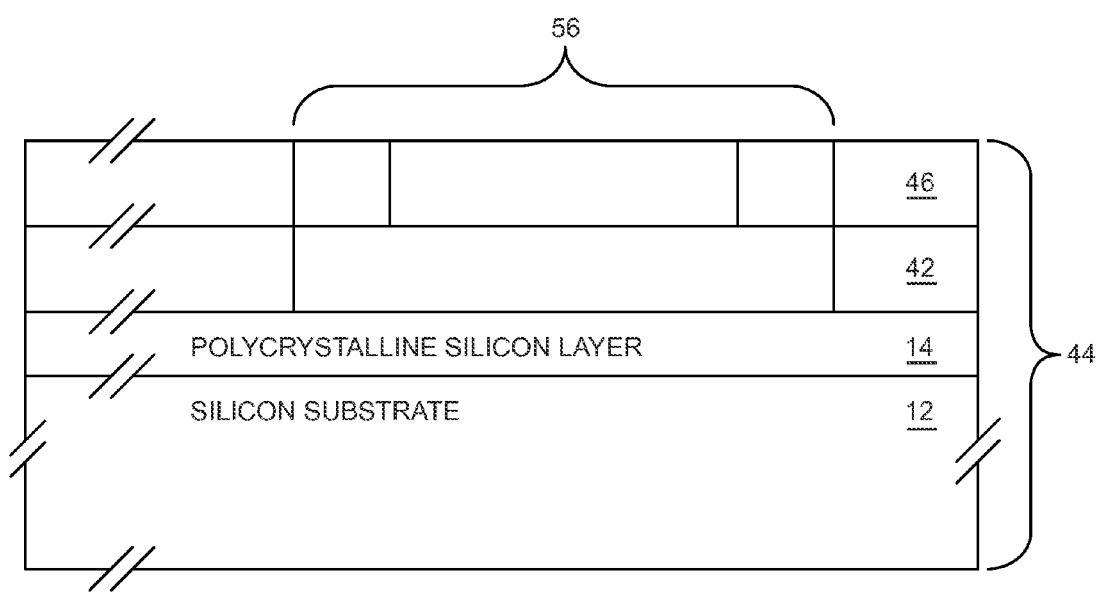
FIG. 11 shows a MEMS filter provided by the SOI wafer illustrated in FIG. 9.

FIG. 11 shows a side view of a MEMS filter 56 provided by the SOI wafer 44 illustrated in FIG. 9. The MEMS filter 56 may be formed from the SOI device layer 46 and may be used to filter RF signals. Alternate embodiments of the present invention may provide other MEMS devices by the SOI wafer 44 illustrated in FIG. 9. The other MEMS devices may be formed using the SOI device layer 46.

Figure 12:
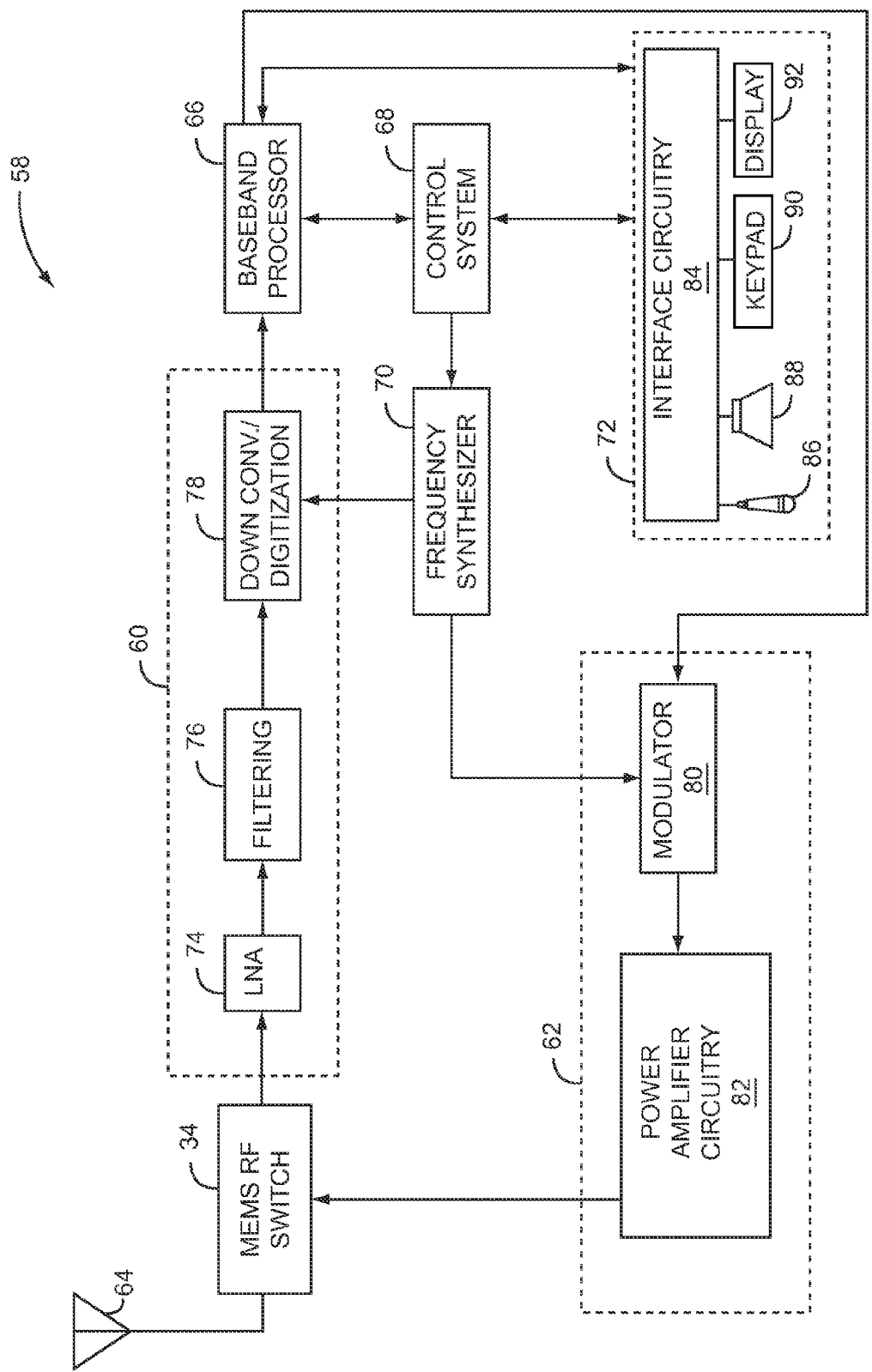
FIG. 12 shows an application example of the present invention used in a mobile terminal.

An application example of the present invention is the MEMS RF switch 34 used to switch RF signals in a mobile terminal 58, the basic architecture of which is represented in FIG. 12. The mobile terminal 58 may include a receiver front end 60, a radio frequency transmitter section 62, an antenna 64, the MEMS RF switch 34, a baseband processor 66, a control system 68, a frequency synthesizer 70, and an interface 72. The receiver front end 60 receives information bearing radio frequency signals from one or more remote transmitters provided by a base station (not shown). A low noise amplifier (LNA) 74 amplifies the signal. A filter circuit 76 minimizes broadband interference in the received signal, while down conversion and digitization circuitry 78 down converts the filtered, received signal to an intermediate or baseband frequency signal, which is then digitized into one or more digital streams. The receiver front end 60 typically uses one or more mixing frequencies generated by the frequency synthesizer 70. The baseband processor 66 processes the digitized received signal to extract the information or data bits conveyed in the received signal. This processing typically comprises demodulation, decoding, and error correction operations. As such, the baseband processor 66 is generally implemented in one or more digital signal processors (DSPs).

On the transmit side, the baseband processor 66 receives digitized data, which may represent voice, data, or control information, from the control system 68, which it encodes for transmission. The encoded data is output to the transmitter 62, where it is used by a modulator 80 to modulate a carrier signal that is at a desired transmit frequency. Power amplifier circuitry 82 amplifies the modulated carrier signal to a level appropriate for transmission, and delivers the amplified and modulated carrier signal to the antenna 64 through the MEMS RF switch 34.

A user may interact with the mobile terminal 58 via the interface 72, which may include interface circuitry 84 associated with a microphone 86, a speaker 88, a keypad 90, and a display 92. The interface circuitry 84 typically includes analog-to-digital converters, digital-to-analog converters, amplifiers, and the like. Additionally, it may include a voice encoder/decoder, in which case it may communicate directly with the baseband processor 66. The microphone 86 will typically convert audio input, such as the user's voice, into an electrical signal, which is then digitized and passed directly or indirectly to the baseband processor 66. Audio information encoded in the received signal is recovered by the baseband processor 66, and converted by the interface circuitry 84 into an analog signal suitable for driving the speaker 88. The keypad 90 and display 92 enable the user to interact with the mobile terminal 58, input numbers to be dialed, address book information, or the like, as well as monitor call progress information.

Those skilled in the art will recognize improvements and modifications to the preferred embodiments of the present invention. All such improvements and modifications are considered within the scope of the concepts disclosed herein and the claims that follow.

What is claimed is:

1. A Silicon-on-insulator (SOI) wafer comprising:
   a semiconductor substrate;
   a trap-rich layer formed over the semiconductor substrate and used to trap carriers from the semiconductor substrate, thereby substantially immobilizing a surface conduction layer in the semiconductor substrate;
   an insulator layer formed over the trap-rich layer;
   an intervening layer over the insulator layer, the intervening layer comprising:
      at least one of a micro-electromechanical systems (MEMS) radio frequency (RF) device and an RF transistor element formed using an SOI device layer, which is formed over the insulator layer; and
      a second insulator formed over the SOI device layer; and
   a metallization layer over the intervening layer.

2. The SOI wafer of claim 1 wherein the trap-rich layer is a polycrystalline Silicon layer and the semiconductor substrate is a Silicon substrate.

3. The SOI wafer of claim 2 further comprising the MEMS RF device.

4. The SOI wafer of claim 3 wherein the MEMS RF device comprises a MEMS RF filter.

5. The SOI wafer of claim 2 further comprising the RF transistor element.

6. The SOI wafer of claim 1 wherein the insulator layer comprises a silicon nitride layer.

7. The SOI wafer of claim 2 wherein a carrier concentration in the polycrystalline Silicon layer is less than a concentration of traps in the polycrystalline Silicon layer.

8. The SOI wafer of claim 7 wherein the polycrystalline Silicon layer is doped.

9. The SOI wafer of claim 2 wherein a thickness of polycrystalline Silicon layer is greater than about 100 nanometers.

10. The SOI wafer of claim 2 wherein an average release time of a carrier trapped in a trap of polycrystalline Silicon layer is greater than about 100 microseconds.

11. The SOI wafer of claim 2 wherein the Silicon substrate has a majority carrier relaxation time.

12. The SOI wafer of claim 11 wherein the majority carrier relaxation time is about equal to a resistivity of the Silicon substrate times a dielectric permittivity of the Silicon substrate.

13. The SOI wafer of claim 12 wherein a thickness of the polycrystalline Silicon layer is equal to about 300 nanometers, the resistivity of the Silicon substrate is greater than about 1000 ohm-centimeters, and the dielectric permittivity of the Silicon substrate is equal to about one picofarad per centimeter.

* * * * *